(12) United States Patent
Kobayashi et al.

(10) Patent No.: US 10,374,568 B2
(45) Date of Patent: *Aug. 6, 2019

(54) COMMON MODE FILTER

(71) Applicant: TDK Corporation, Tokyo (JP)

(72) Inventors: Tsutomu Kobayashi, Tokyo (JP); Toshio Tomonari, Tokyo (JP); Emi Ito, Yamagata (JP); Yuma Koyama, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/192,047

(22) Filed: Nov. 15, 2018

(65) Prior Publication Data
US 2019/0089320 A1 Mar. 21, 2019

Related U.S. Application Data

(63) Continuation of application No. 15/461,303, filed on Mar. 16, 2017, now Pat. No. 10,193,516.

(30) Foreign Application Priority Data

Mar. 30, 2016 (JP) .................................. 2016-067152

(51) Int. Cl.
| | | |
|---|---|---|
| *H01F 5/00* | (2006.01) | |
| *H03H 1/00* | (2006.01) | |
| *H01F 41/069* | (2016.01) | |
| *H01F 27/28* | (2006.01) | |
| *H01F 27/00* | (2006.01) | |
| *H01F 17/04* | (2006.01) | |
| *H03H 7/42* | (2006.01) | |
| *H01F 17/00* | (2006.01) | |

(52) U.S. Cl.
CPC ................. *H03H 1/00* (2013.01); *H01F 5/00* (2013.01); *H01F 17/045* (2013.01); *H01F 27/006* (2013.01); *H01F 27/2823* (2013.01); *H01F 41/069* (2016.01); *H03H 7/427* (2013.01); *H01F 2017/0093* (2013.01); *H03H 2001/0021* (2013.01); *H03H 2001/0035* (2013.01); *H03H 2001/0092* (2013.01)

(58) Field of Classification Search
CPC ........................... H01F 5/00; H01F 27/00–36
USPC .... 336/65, 83, 192, 200, 212, 220–223, 232
See application file for complete search history.

*Primary Examiner* — Tuyen T Nguyen
(74) *Attorney, Agent, or Firm* — Young Law Firm, P.C.

(57) ABSTRACT

Disclosed herein is a common mode filter that includes first and second terminal electrodes provided on the first flange part, third and fourth terminal electrodes provided on the second flange part, a first wire wound around the winding core part and having one end connected to the first terminal electrode and other end connected to the third terminal electrode, and a second wire wound around the winding core part and having one end connected to the second terminal electrode and other end connected to the fourth terminal electrode. The winding core part includes a first winding region, a second winding region, and a third winding region positioned between the first and second winding regions in the axial direction. The first and second wires are bifilar-wound in the first and second winding regions and layer-wound in the third winding region.

10 Claims, 9 Drawing Sheets

COMMON MODE FILTER

BACKGROUND OF THE INVENTION

Field of the Invention

The present invention relates to a common mode filter and, more particularly to a common mode filter excellent in high frequency characteristics.

Description of Related Art

A common mode filter is widely used in many electronic devices such as mobile electronic devices and on-vehicle LANs to remove common mode noise superimposed on differential signal lines. In recent years, a common mode filter using a surface-mountable drum core supersedes a common mode filter using a toroidal core (see Japanese Patent Application Laid-open No. 2008-208331).

As a winding method of a wire around the drum core, a bifilar winding and a layer winding are known. The bifilar winding is a type of winding where two wires are wound in parallel in the same turn and has advantages in that it can obtain good signal balance and has less unnecessary parasitic capacitance. The layer winding is a type of winding where first and second wires are wound in first and second layers, respectively, and has an advantage in that a larger number of turns can be ensured.

In recent, a common mode filter that finds application particularly in on-vehicle LAN has been demanded to have high-frequency characteristics improved than ever before. Specifically, for example, there is a demand for further reducing Sdc characteristics indicating the rate at which a common mode signal input to the common mode filter is converted into a differential signal or Scd characteristics indicating the rate at which a differential signal input to the common mode filter is converted into a common mode signal.

To satisfy the above Sdc and Scd characteristics, it is necessary to improve signal balance in a high-frequency band and, to this end, the bifilar winding is preferably adopted. However, the bifilar winding is low in the utilization efficiency of a winding core part, so that the length of the winding core part inevitably needs to be increased to ensure necessary inductance.

Thus, the present inventors have studied to ensure satisfactory high-frequency characteristics while suppressing the length of the winding core part by winding a part of the wire in a bifilar fashion and the remaining part thereof in a layer fashion. As a result, it is found that a difference occurs in the high-frequency characteristics depending on how the bifilar winding part and layer winding part are laid out.

SUMMARY

It is therefore an object of the present invention is to further improve the high-frequency characteristics of the common mode filter having the bifilar winding part and layer winding part.

A common mode filter according to the present invention includes a core including a winding core part extending in an axial direction, a first flange part provided at one end of the winding core part in the axial direction, and a second flange part provided at other end of the winding core part in the axial direction; first and second terminal electrodes provided on the first flange part; third and fourth terminal electrodes provided on the second flange part; a first wire wound around the winding core part and having one end connected to the first terminal electrode and other end connected to the third terminal electrode; and a second wire wound around the winding core part and having one end connected to the second terminal electrode and other end connected to the fourth terminal electrode, wherein the winding core part includes a first winding region, a second winding region, and a third winding region positioned between the first and second winding regions in the axial direction, and wherein the first and second wires are bifilar-wound in the first and second winding regions and layer-wound in the third winding region.

According to the present invention, the bifilar winding part is inserted between the layer winding part and the first and second flange parts, so that a predetermined distance is ensured between the layer winding part and the first and second flange parts. The layer winding part has a higher winding density than the bifilar winding part, so that an unnecessary parasitic capacitance may be generated when the distance between the layer winding part and the first or second flange part is small. However, in the common mode filter according to the present invention, a sufficient distance is ensured between the layer winding part and the first and second flange parts, so that the unnecessary parasitic capacitance component is suppressed from occurring, thereby allowing high-frequency characteristics to be enhanced.

In the present invention, it is preferable that the number of turns of the first and second wires in the first winding region is the same as that of the first and second wires in the second winding region. With this configuration, the two bifilar winding parts are symmetric with respect to the layer winding part, and this allows for improved signal balance.

In the present invention, it is preferable that the third winding region includes a first layer region positioned on the first winding region side and a second layer region positioned on the second winding region side and that the first and second wires cross each other between the first and second layer regions. With this configuration, the positions of the first and second wires are replaced with each other with the crossing position as a boundary, which allows signal balance to be further improved.

In this case, it is preferable that the number of turns of the first and second wires in the first layer region is the same as that of the first and second wires in the second layer region. With this configuration, the two layer winding parts are symmetric with respect to the crossing position, thus achieving even higher signal balance.

Further, it is preferable that the second wire is wound on the first wire in the first layer region and that the first wire is wound on the second wire in the second layer region. With this configuration, upper and lower positions of the first and second wires are replaced with each other in the third winding region, and this obtains signal balance improved even more.

Further, it is preferable that in the first and second winding region, the first and second wires are bifilar-wound such that a space is formed between the adjacent turns of the first and second wires. This reduces a parasitic capacitance component generated in the adjacent turns, achieving more enhanced high-frequency characteristics.

In the present invention, it is preferable that the first and second flange parts each have an inner side surface connected to the winding core part and that the first and second wires are separated from the inner side surface. This can further reduce an unnecessary parasitic capacitance component generated due to existence of the first and second flange parts.

As described above, according to the present invention, there can be provided a common mode filter having significantly enhanced high-frequency characteristics.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

First Embodiment

Figure 1:
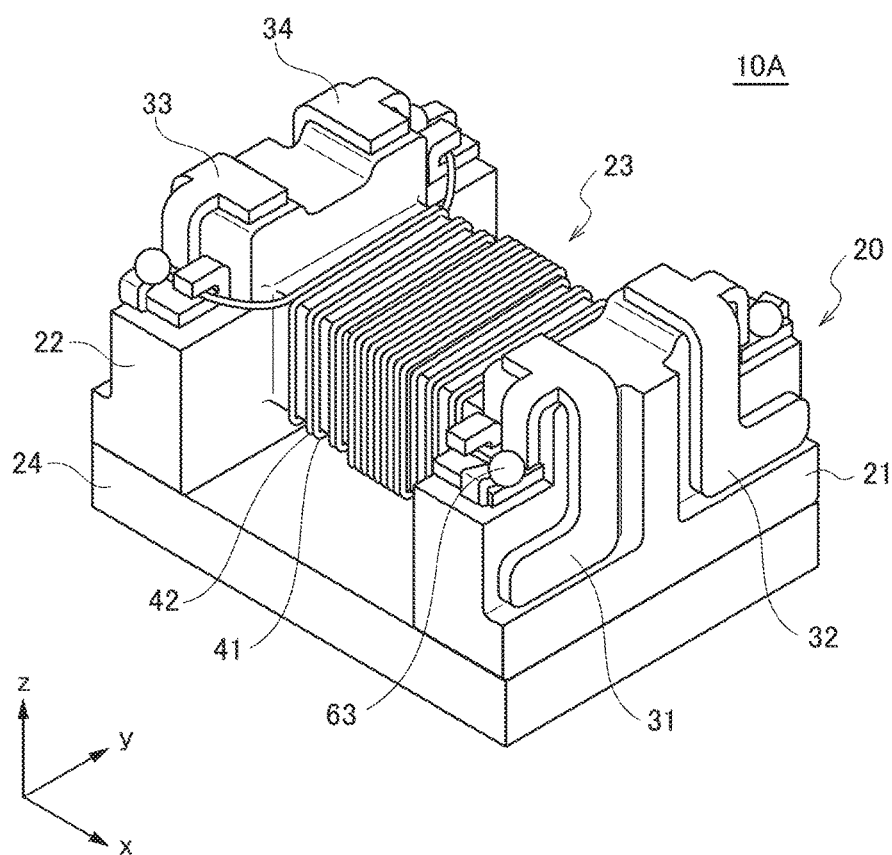
FIG. 1 is a schematic perspective view illustrating an outer appearance of a common mode filter according to a first embodiment of the present invention.

FIG. 1 is a schematic perspective view illustrating the outer appearance of a common mode filter 10A according to the first embodiment of the present invention.

Figure 2:
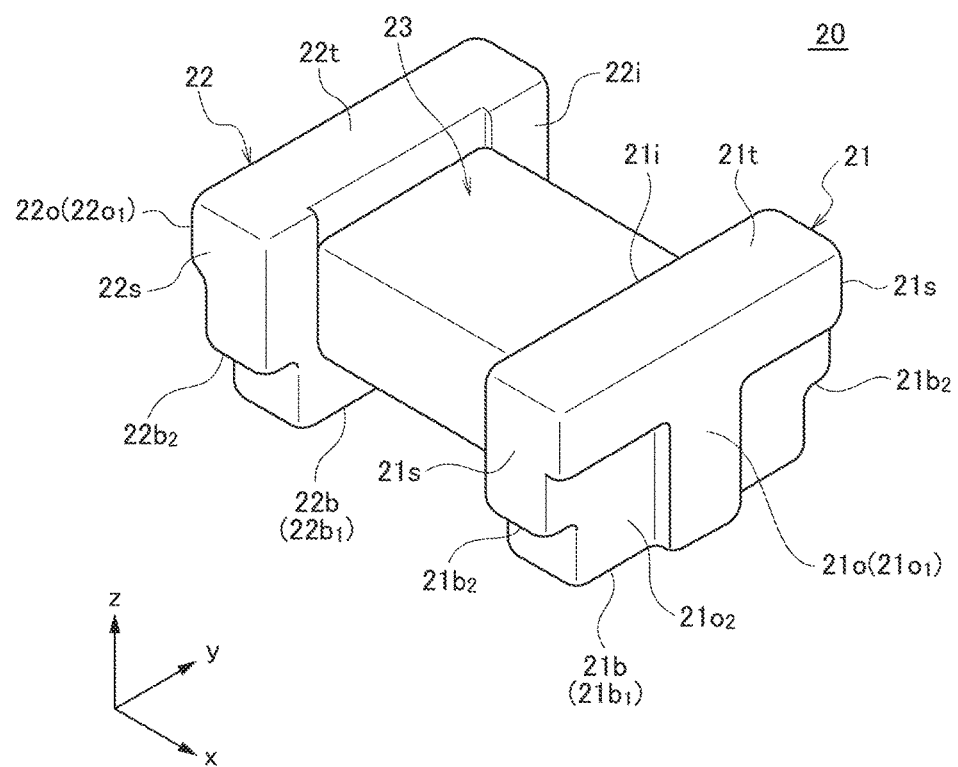
FIG. 2 is a schematic perspective view illustrating the core shown in FIG. 1.
Figure 3:
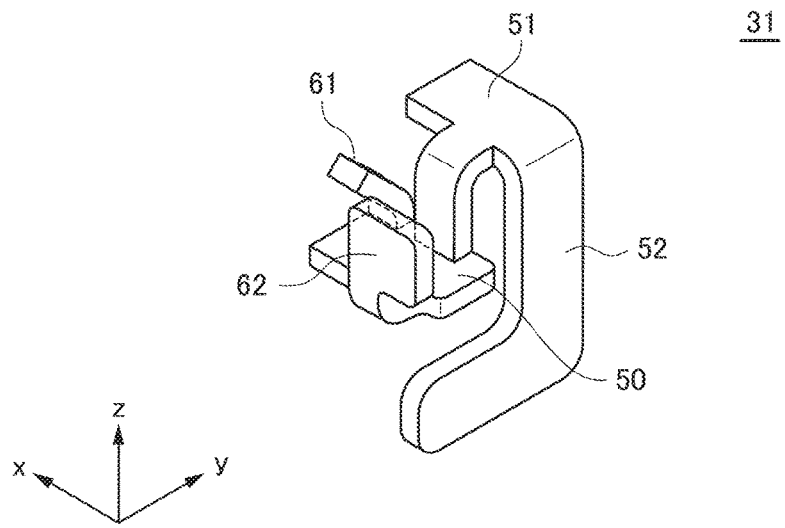
FIG. 3 is a schematic perspective view illustrating the first terminal electrode shown in FIG. 1.

As illustrated in FIG. 1, the common mode filter 10A according to the present embodiment includes a drum core 20, a plate core 24, first to fourth terminal electrodes 31 to 34, and first and second wires 41 and 42. The structure of the core 20 is illustrated in FIG. 2, and the structure of the first terminal electrode 31 is illustrated in FIG. 3. The cores 20 and 24 are each formed of a magnetic material having a comparatively high permeability, such as an Ni—Zn based ferrite. The first to fourth terminal electrodes 31 to 34 are each a metal fitting formed of a good conductor material such as copper.

The core 20 has a first flange part 21, a second flange part 22, and a winding core part 23 disposed between the first and second flange parts 21 and 22. The winding core part 23 has its axis direction in the x-direction. The first and second flange parts 21 and 22 are disposed at opposite ends of the winding core part 23 in the axial direction and integrally formed with the winding core part 23. The first flange part 21 has an inner side surface $21i$ connected to the winding core part 23, an outer side surface $21o$ positioned on the side opposite the inner side surface $21i$, a top surface $21t$ to which the plate core 24 is bonded, a bottom surface $21b$ positioned on the side opposite the top surface $21t$, and side surfaces $21s$ positioned so as to be opposite each other. The inner side surface $21i$ and outer side surface $21o$ each constitute the yz plane, the top surface $21t$ and bottom surface $21b$ each constitute the xy plane, and the side surfaces $21s$ each constitute the xz plane. Similarly, the second flange part 22 has an inner side surface $22i$ and an outer side surface $22o$ each constituting the yz plane, a top surface $22t$ and a bottom surface $22b$ each constitute the xy plane, and two side surfaces $22s$ each constitute the xz plane.

As illustrated in FIG. 2, the bottom surfaces $21b$, $22b$ and outer side surfaces $21o$, $22o$ each have a step. Specifically, the bottom surface $21b$ has an upper stage surface $21b_1$ and a lower stage surface $21b_2$, the bottom surface $22b$ has an upper stage surface $22b_1$ and a lower stage surface $22b_2$, the outer side surface $21o$ has an upper stage surface $21o_1$ and a lower stage surface $21o_2$, and the outer side surface $22o$ has an upper stage surface $22o_1$ and a lower stage surface $22o_2$. The first and second terminal electrodes 31 and 32 are disposed so as to cover the upper stage surface $21b_1$, lower stage surface $21b_2$, and lower stage surface $21o_2$ of the first flange part 21, and the third and fourth terminal electrodes 33 and 34 are disposed so as to cover the upper stage surface $22b_1$, lower stage surface $22b_2$, and lower stage surface $22o_2$ of the second flange part 22. The fixing of the first to fourth terminals 31 to 34 is made by using an adhesive or the like.

As illustrated in FIG. 3, the first terminal electrode 31 has a wire connection part 50, a first connection part 51, and a second connection part 52. The wire connection part 50 is a part that covers the lower stage surface $21b_2$ of the bottom surface $21b$ and is connected with one end of the first wire 41. As illustrated in FIG. 3 which illustrates a state before wire connection, the wire connection part 50 has a fixing piece 61 for holding one end of the first wire 41 and a welding piece 62 for welding the one end of the first wire 41 thereto. Specifically, the wire connection is made as follows. That is, in a state where the fixing piece 61 is folded to hold the one end of the first wire 41, the welding piece 62 is folded to hold the one end of the first wire 41 between the wire connection part 50 and the welding piece 62, and then laser beam is irradiated to melt the welding piece 62, to thereby weld the one end of the first wire 41 to the wire connection part 50. After the welding, a weld ball 63 illustrated in FIG. 1 is formed, whereby the one end of the first wire 41 and the wire connection part 50 are firmly fixed.

The first connection part 51 is a part that covers the upper stage surface $21b_1$ of the bottom surface $21b$ and faces a land pattern on a printed circuit board at mounting. The second connection part 52 is a part that covers the lower stage surface $21o_2$ of the outer side surface $21o$ and is a part at which a solder fillet is formed at mounting. In the present embodiment, the second connection part 52 has a shape folded in an L-shape, which enhances mounting strength.

Other terminal electrodes 32 to 34 have the same structure. The one and the other ends of the first wire 41 are connected to the first and third terminal electrodes 31 and 33, respectively, and one and the other ends of the second wire 42 are connected to the second and fourth terminal electrodes 32 and 34, respectively. As a result, common mode filter circuitry is formed in which, for example, a pair of the first and second terminal electrodes 31 and 32 serve as an input side and a pair of the third and fourth terminal electrodes 33 and 34 serve as an output side. However, the common mode filter 10A according to the present embodiment has no directivity, so that it is possible to use the pair of third and fourth terminal electrodes 33 and 34 as the input side and the pair of the first and second terminal electrodes 31 and 32 as the output side. Further, the terminal electrodes 31 to 34 each have the structure illustrated in FIG. 3, so that firm connection to the corresponding wires 41 and 42 can be made. In addition, the weld ball 63 is formed in the lower stage surfaces $21b_2$ and $22b_2$ of the bottom surfaces $21b$ and $22b$, so that it is possible to prevent unstable mounting which may be caused due to interference between the weld ball 63 and the printed circuit board.

Figure 4:
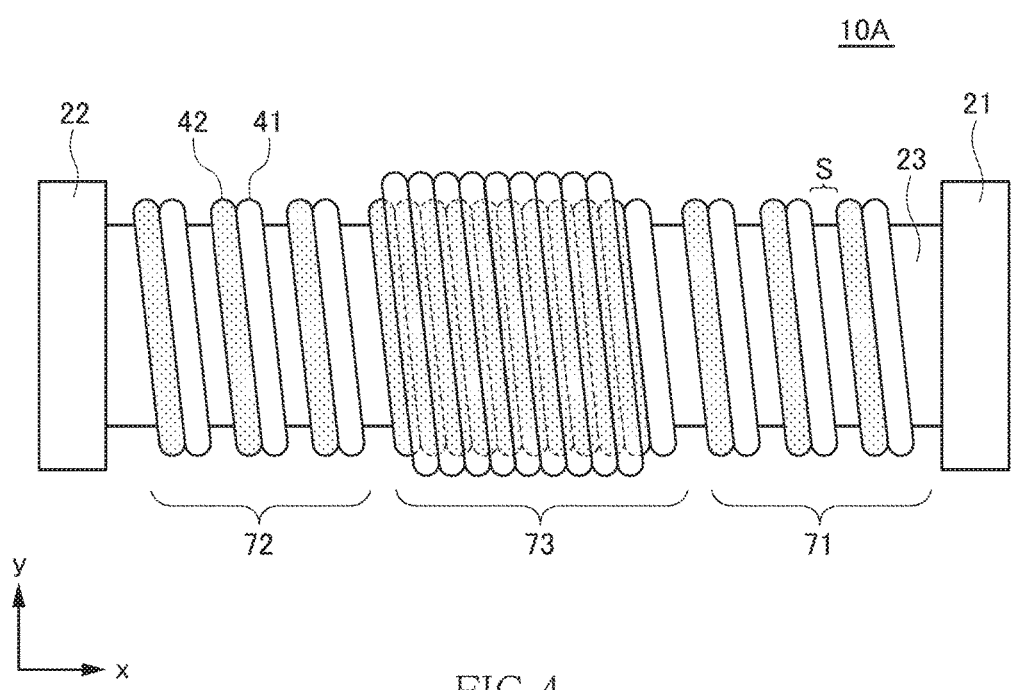
FIG. 4 is a schematic view for explaining the winding layout in the common mode filter according to the first embodiment.

FIG. 4 is a schematic view for explaining the winding layout of the first and second wires 41 and 42 in the present embodiment.

As illustrated in FIG. 4, the winding core part 23 of the core 20 includes a first winding region 71 positioned on the first flange part 21 side, a second winding region 72 positioned on the second flange part 22 side, and a third winding region 73 positioned between the first and second winding regions 71 and 72. That is, the first winding region 71, third winding region 73, and second winding region 72 are arranged in this order in the x-direction from the first flange part 21 toward the second flange part 22.

In the present embodiment, the first and second wires 41 and 42 are bifilar-wound in the first and second winding regions 71 and 72, while the first and second wires 41 and 42 are layer-wound in the third winding region 73. The bifilar winding is a type of winding where a pair of wires is wound in parallel in the same turn. The layer winding is a type of winding where one of a pair of wires is wound in a lower layer to form a first winding layer, and the other one thereof is wound on the first winding layer to form a second winding layer.

More specifically, in the first winding region 71, the first to third turns of the respective first and second wires 41 and 42 are bifilar-wound. Although the number of turns in the first winding region 71 is not limited to this, it is preferably two or more in order to sufficiently obtain the effect of the present embodiment. In the first winding region 71, the first and second wires 41 and 42 in the same turn are positioned on the first flange part 21 side and on the second flange part 22 side, respectively, and this arrangement is repeated over a plurality of turns. As a result, in the first winding region 71, the first and second wires 41 and 42 are alternately wound in this order in the x-direction from the first flange part 21 toward the second flange part 22.

In the first winding region 71, the first and second wires 41 and 42 are wound adjacently, preferably, in contact with each other in the same turn. This allows a good signal balance to be obtained. On the other hand, a space S is formed between the adjacent turns of the first and second wires 41 and 42. For example, the second turn of the first wire 41 and the first turn of the second wire 42 do not contact each other, and the space S is formed therebetween in the x-direction. This reduces a parasitic capacitance component generated in the adjacent turns, thereby enhancing high-frequency characteristics.

Similarly, in the second winding region 72, the 14th to 16th turns of the respective first and second wires 41 and 42 are bifilar-wound. In the second winding region 72 as well, the first and second wires 41 and 42 in the same turn are positioned on the first flange part 21 side and on the second flange part 22 side, respectively, and this arrangement is repeated over a plurality of turns. As a result, in the second winding region 72, the second and first wires 42 and 41 are alternately wound in this order in the x-direction from the second flange part 22 toward the first flange part 21.

Although the number of turns in the first winding region 71 or second winding region 72 is not particularly limited, it is preferable that the number of turns of the first and second wires 41 and 42 in the first winding region 71 and that of the first and second wires 41 and 42 in the second winding region 72 are the same as each other. This increases the grade of symmetry to allow signal balance to be further improved.

On the other hand, in the third winding region 73, the second wire 42 is wound in a lower layer, and the first wire 41 is wound on the second wire 42. In the example of FIG. 4, in the third winding region 73, the first and second wires 41 and 42 are each wound in 10 turns; however, this is just an example, and the specific number of turns is not limited to this. It should be noted that the fourth turn of the first wire 41 is wound in the lower layer like the second wire 42 in the third winding region 73. This is because, in the layer winding, the number of turns of the wire in the upper layer is smaller by one than that of the wire in the lower layer since the wire in the upper layer is wound along a valley line formed by the wire in the lower layer for stabilization of a winding state. That is, when the numbers of turns of the pair of wires are made to coincide with each other in the layer winding, one turn of the wire to be wound in the upper layer is inevitably dropped to the lower layer.

The first and second wires 41 and 42 can be wound with higher density in the layer winding than in the bifilar winding, so that it is possible to increase the number of turns of the first and second wires 41 and 42 while suppressing the length of the winding core part 23 in the x-direction. However, in the layer winding, a parasitic capacitance is likely to be generated between the layer winding part and other member because of the high winding density. Particularly, when the layer winding part is laid out in the vicinity of the first flange part 21 or second flange part 22, a slight parasitic capacitance may be generated between the layer winding part and the first to fourth terminal electrodes 31 to 34, resulting in degradation in high-frequency characteristics. However, in the common mode filter 10A according to the present embodiment, the layer winding part is laid out in the third winding region 73 separated away from the first and second flange parts 21 and 22, so that the above-mentioned parasitic capacitance component is suppressed from occurring, thereby allowing high-frequency characteristics to be enhanced.

The parasitic capacitance between the first and second wires 41 and 42 and the first to fourth terminal electrodes 31 to 34 is also generated in the bifilar winding part. In the present embodiment, in order to suppress such a parasitic capacitance component as much as possible, the first and second wires 41 and 42 are separated from the inner side surfaces $21i$ and $22i$ of the respective first and second flange parts 21 and 22.

Specifically, the first turn of the first wire 41 and the inner side surface $21i$ of the first flange part 21 are separated from each other so as not to come into contact with each other, and the last turn (16th turn) of the second wire 42 and the inner side surface $22i$ of the second flange part 22 are separated from each other so as not to come into contact with each other. Although the separation distance is not particularly limited, one to three times, preferably, about double a wire diameter. As a result, the parasitic capacitance between the first to fourth terminal electrodes 31 to 34 that can be generated also in the bifilar winding part is suppressed, allowing high-frequency characteristics to be further enhanced.

As described above, in the common mode filter 10A according to the present embodiment, the first and second wires 41 and 42 are bifilar-wound in the first and second winding regions 71 and 72 positioned in the vicinity of the first and second flange parts 21 and 22, while they are layer-wound in the third winding region 73 separated from the first and second flange parts 21 and 22. As a result, a sufficient number of turns can be ensured with a limited size, and the parasitic capacitance component mainly generated by the layer winding part is reduced, whereby it is possible to suppress degradation in signal characteristics in a high-frequency band.

Second Embodiment

Figure 5:
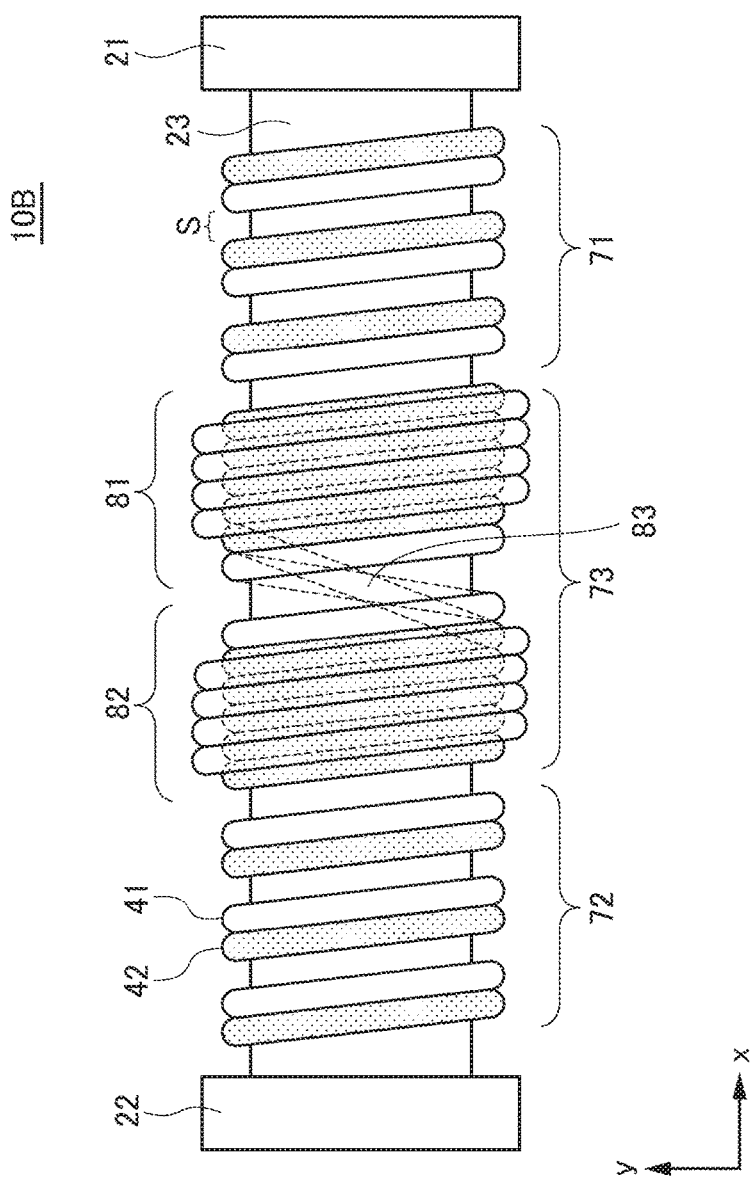
FIG. 5 is a schematic view for explaining the winding layout in a common mode filter according to a second embodiment of the present invention.

FIG. 5 is a schematic view for explaining the winding layout in a common mode filter 10B according to the second embodiment of the present invention.

As illustrated in FIG. 5, the common mode filter 10B according to the present embodiment differs from the common mode filter 10A according to the first embodiment in the winding layout in the third winding region 73. Other basic configurations are the same as those of the common mode filter 10A according to the first embodiment, so the same reference numerals are given to the same elements, and overlapping description will be omitted.

In the present embodiment, the third winding region 73 includes first and second layer regions 81 and 82, and the first and second wires 41 and 42 cross each other at a cross point 83 positioned between the first and second layer regions 81 and 82. The first layer region 81 is positioned on the first winding region 71 side, where the first and second wires 41 and 42 are each wound in five turns. The second layer region 82 is positioned on the second winding region 72 side, where the first and second wires 41 and 42 are each wound in five turns.

In the present embodiment, in both the first and second layer regions 81 and 82, the second wire 42 is wound in the lower layer, and the first wire 41 is wound on the second wire 42. However, as described above, in the layer winding, one turn of the wire to be wound in the upper layer is dropped to the lower layer. Thus, in the present embodiment, one turn of the first wire 41 is dropped to the lower layer in each of the first and second layer regions 81 and 82. In the example of FIG. 5, the dropped turns are positioned on the cross point 83 side.

With the above configuration, the first wire 41 and the second wire 42 are symmetric with each other with respect to the cross point 83. The symmetric relationship is satisfied not only between the first and second layer regions 81 and 82 but also in the first and second winding regions 71 and 72. That is, in the first winding region 71, the first and second wires 41 and 42 in the same turn are positioned on the second flange part 22 side and on the first flange part 21 side, respectively, while in the second winding region 72, the first and second wires 41 and 42 in the same turn are positioned on the first flange part 21 side and on the second flange part 22 side, respectively. In other words, in both the first and second winding regions 71 and 72, the first and second wires 41 and 42 in the same turn are positioned at the inner side (third winding region 73 side) and at the outer side (flange part 21 or 22 side). This further improves signal balance, so that it is possible to obtain more improved high-frequency characteristics than in the common mode filter 10A according to the first embodiment.

Figure 6:
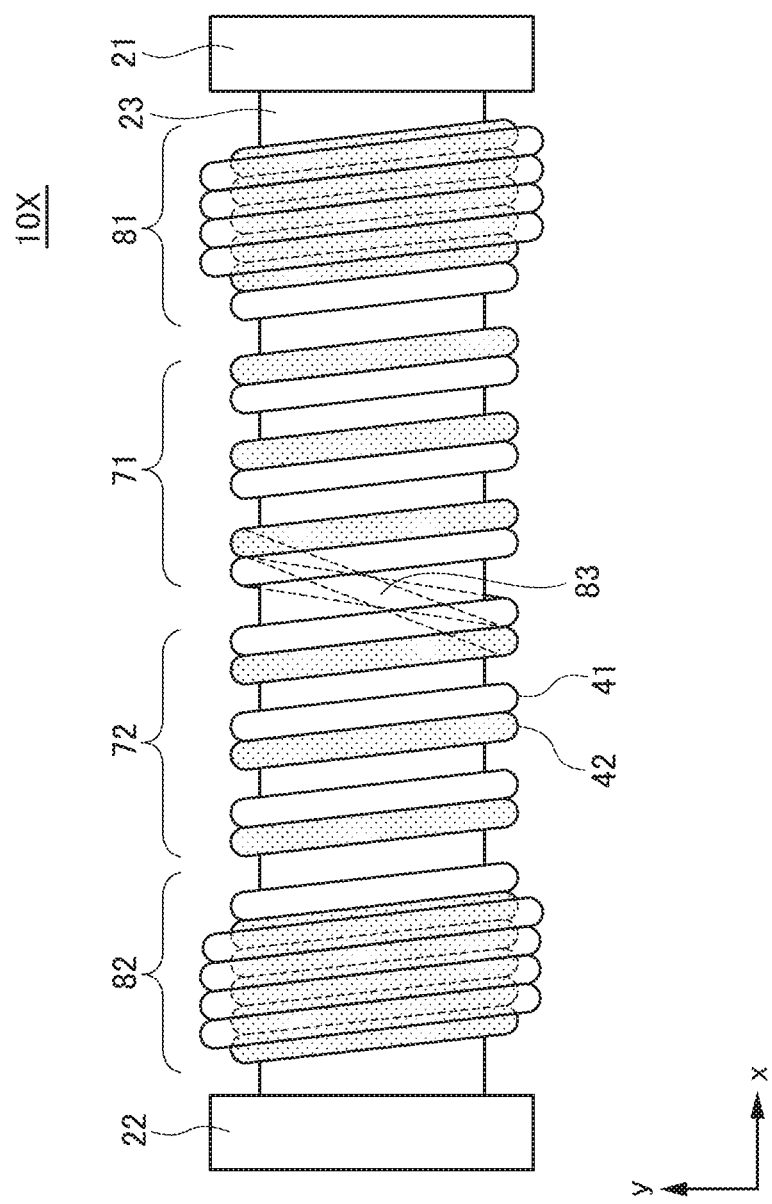
FIG. 6 is a schematic view for explaining the winding layout in a common mode filter according to a reference example.

FIG. 6 is a schematic view for explaining the winding layout in a common mode filter 10X according to a reference example.

As illustrated in FIG. 6, the common mode filter 10X according to the reference example includes the layer winding part (81), bifilar winding part (71), bifilar winding part (72) and layer winding part (82) in this order from the first flange part 21 toward the second flange part 22. That is, the common mode filter 10X differs from the common mode filter 10B according to the second embodiment illustrated in FIG. 5 in that the positions of the first winding region 71 and the first layer region 81 are replaced with each other and that the positions of the second winding region 72 and the second layer region 82 are replaced with each other. The cross point 83 is positioned at the intermediary point found between the first winding region 71 and second winding region 72.

In such a configuration, the layer winding part is laid out in the vicinity of the flange part 21 or 22, so that a parasitic capacitance is generated between the layer winding part and the first to fourth terminal electrodes 31 to 34, with the result that high-frequency characteristics are degraded as compared with the common mode filter 10B according to the second embodiment.

Figure 7:
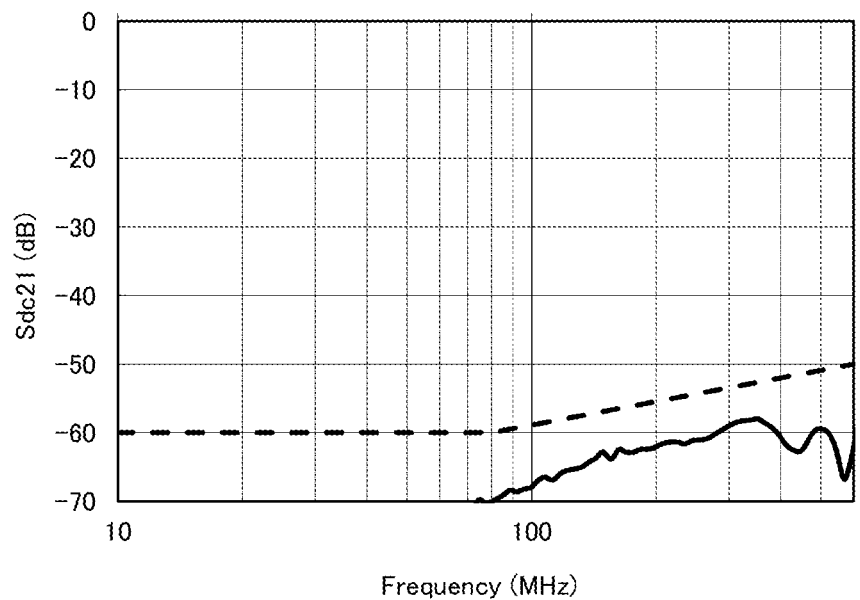
FIG. 7 is a graph illustrating the Sdc21 characteristics of the common mode filter according to the second embodiment.
Figure 8:
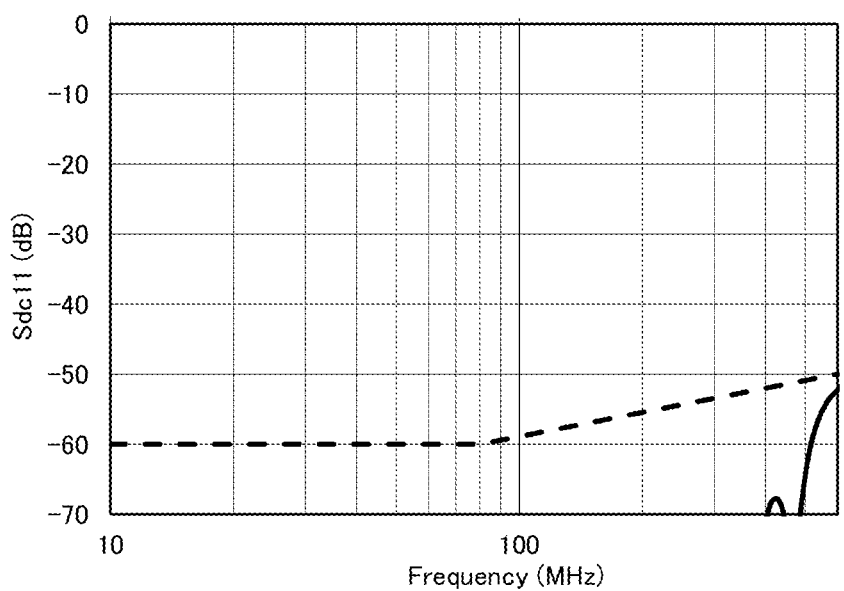
FIG. 8 is a graph illustrating the Sdc11 characteristics of the common mode filter according to the second embodiment.
Figure 9:
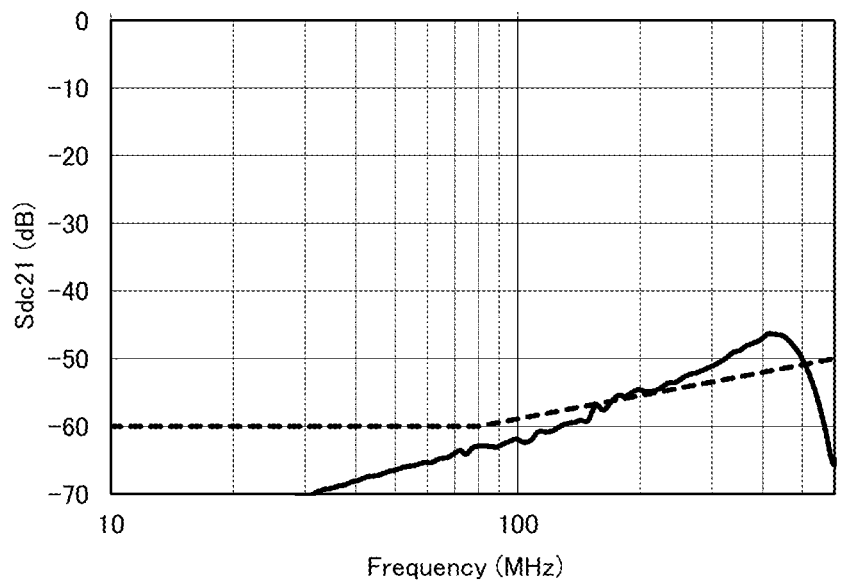
FIG. 9 is a graph illustrating the Sdc21 characteristics of the common mode filter according to the reference example.
Figure 10:
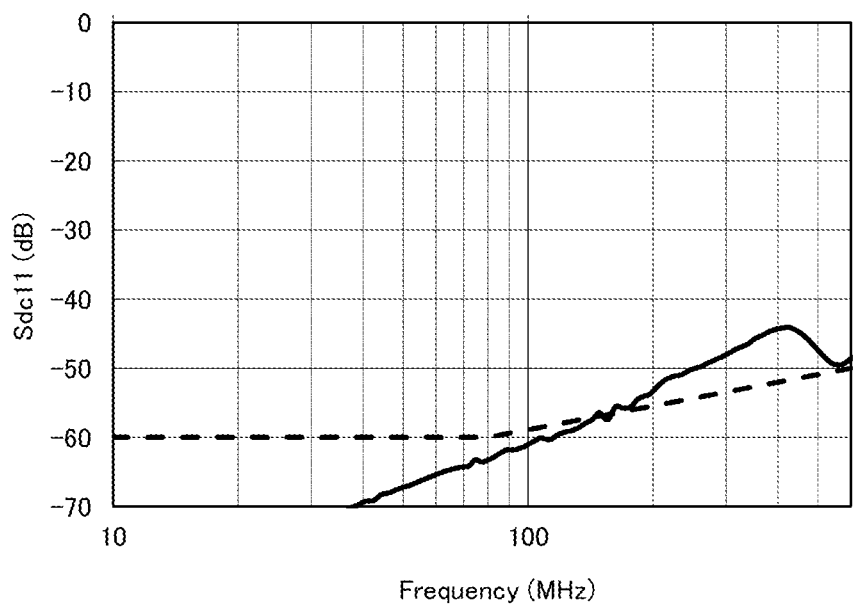
FIG. 10 is a graph illustrating the Sdc11 characteristics of the common mode filter according to the reference example.

FIGS. 7 and 8 are graphs each illustrating the high-frequency characteristics of the common mode filter 10B according to the second embodiment. FIGS. 9 and 10 are graphs each illustrating the high-frequency characteristics of the common mode filter 10X according to the reference example. Among these graphs, FIGS. 7 and 9 each illustrate characteristics called "Sdc21", passing characteristics indicating the rate at which a common mode signal is converted into a differential signal. FIGS. 8 and 10 each illustrate characteristics called "Sdc11", reflection characteristics indicating the rate at which a common mode signal is converted into a differential signal. The dashed line in each of FIGS. 7 to 10 represents a target upper limit value.

As illustrated in FIGS. 7 to 10, the Sdc21 and Sdc11 exhibit more satisfactory results in the common mode filter 10B according to the present embodiment than in the common mode filter 10X according to the reference example. It is considered that this is because the distance between the layer winding part and the flange parts 21 and 22 is larger in the common mode filter 10B according to the present embodiment than in the common mode filter 10X according to the reference example and, thus, the parasitic capacitance component generated between the layer winding part and the first to fourth terminal electrodes 31 to 34 is reduced.

Third Embodiment

Figure 11:
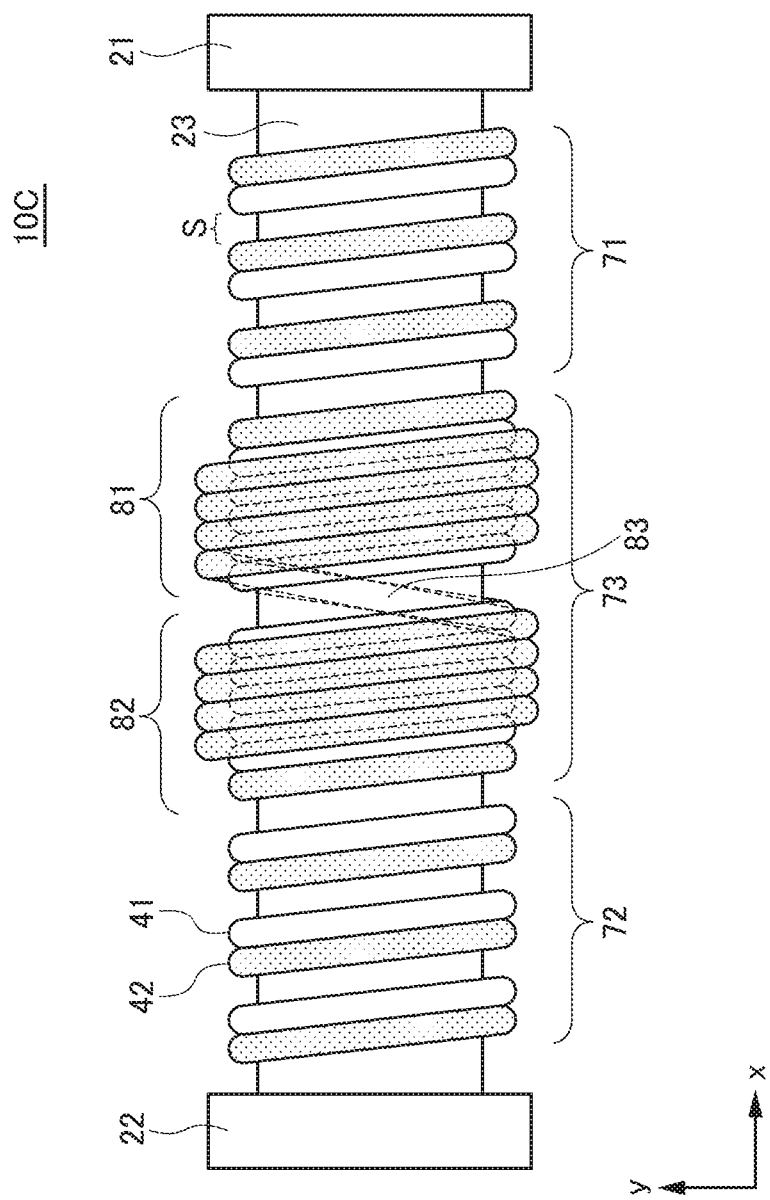
FIG. 11 is a schematic view for explaining the winding layout in a common mode filter according to a third embodiment of the present invention.

FIG. 11 is a schematic view for explaining the winding layout in a common mode filter 10C according to a third embodiment of the present invention.

As illustrated in FIG. 11, the common mode filter 10C according to the present embodiment differs from the common mode filter 10B according to the second embodiment in the winding layout in the third winding region 73. Other configurations are the same as those of the common mode filter 10B according to the second embodiment, so the same reference numerals are given to the same elements, and overlapping description will be omitted.

In the present embodiment, in both the first and second layer regions 81 and 82, the first wire 41 is wound in the lower layer, and the second wire 42 is wound on the first wire 41. However, as described above, in the layer winding, one turn of the wire to be wound in the upper layer is dropped to the lower layer. Thus, in the present embodiment, one turn of the second wire 42 is dropped to the lower layer in each of the first and second layer regions 81 and 82. In the example of FIG. 11, the dropped turns are positioned on the side opposite the cross point 83, i.e., between the third winding region 73 and the first and second winding regions 71 and 72.

Thus, in the configuration according to the present embodiment, the dropped turns of the layer winding are positioned between the third winding region 73 and the first and second winding regions 71 and 72, so that the actually layer-wound part (layer winding part except the dropped turn part) concentrates more on the center. That is, the distance between the actually layer-wound part and the first and second winding regions 71 and 72 becomes larger. Thus, according to the present embodiment, in addition to the effect obtained by the common mode filter 10B according to the second embodiment, further reduction of the parasitic capacitance component is expected.

Fourth Embodiment

Figure 12:
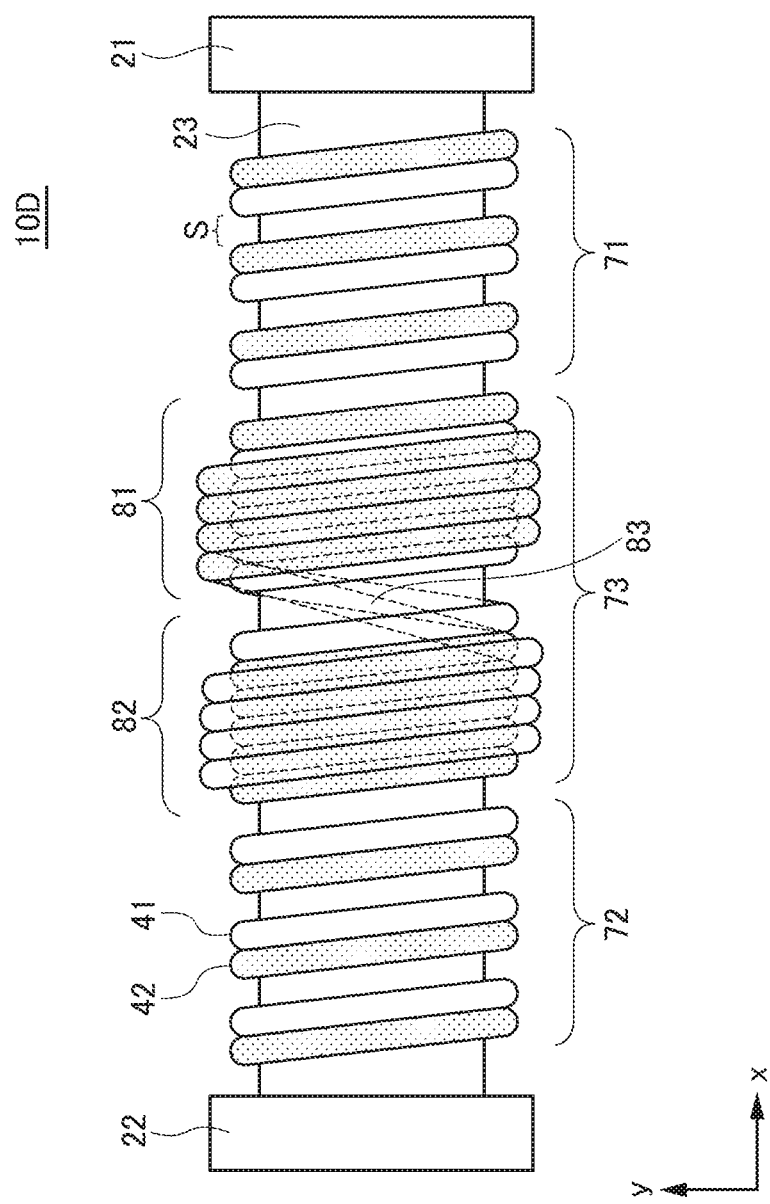
FIG. 12 is a schematic view for explaining the winding layout in a common mode filter according to a fourth embodiment of the present invention.

FIG. 12 is a schematic view for explaining the winding layout in a common mode filter 10D according to a fourth embodiment of the present invention.

As illustrated in FIG. 12, the common mode filter 10D according to the present embodiment differs from the common mode filters 10B and 10C according to the respective second and third embodiments in that the winding pattern in the first layer region 81 is the same as that in the common mode filter 10C and the winding pattern in the second layer region 82 is the same as that in the common mode filter 10B. Other configurations are the same as those of the common mode filters 10B and 10C according to the respective second and third embodiments, so the same reference numerals are given to the same elements, and overlapping description will be omitted.

As described above, the second wire 42 is wound on the first wire 41 in the first layer region 81, and the first wire 41 is wound on the second wire 42 in the second layer region 82. The dropped turns are both positioned on the first flange part 21 side.

With the above configuration, the upper and lower layers are replaced with each other with the cross point 83 as a boundary, so that there is almost no difference between the winding conditions of the first and second wires 41 and 42. This improves signal balance more than in the common mode filters 10B and 10C according to the respective second and third embodiments, so that significantly enhanced high-frequency characteristics can be obtained.

It is apparent that the present invention is not limited to the above embodiments, but may be modified and changed without departing from the scope and spirit of the invention.

For example, although the common mode filters according to the above respective embodiments have a configuration where the four terminal electrodes 31 to 34 are bonded to the core 20, the terminal electrodes 31 to may be directly formed on the core 20 by using a conductive paste or the like.

What is claimed is:

1. A common mode filter comprising:
a core including a winding core part extending in an axial direction, a first flange part provided at one end of the winding core part in the axial direction, and a second flange part provided at other end of the winding core part in the axial direction;
first and second terminal electrodes provided on the first flange part;
third and fourth terminal electrodes provided on the second flange part;
a first wire wound around the winding core part and having one end connected to the first terminal electrode and other end connected to the third terminal electrode; and
a second wire wound around the winding core part and having one end connected to the second terminal electrode and other end connected to the fourth terminal electrode,
wherein the winding core part includes first, second, and third sections arranged in this order from the first flange part to the second flange part,
wherein the first and second wires are bifilar-wound in the first section and layer-wound in each of the second and third sections, and
wherein the first and second wires cross each other between the second and third sections.

2. The common mode filter as claimed in claim 1, wherein a number of turns of the first and second wires in the first section is smaller than that of the first and second wires in each of the second and third sections.

3. The common mode filter as claimed in claim 2, wherein a number of turns of the first and second wires in the second section is a same as that of the first and second wires in the third section.

4. The common mode filter as claimed in claim 1, wherein the second wire is wound on the first wire in each of the second and third sections.

5. The common mode filter as claimed in claim 1,
wherein the second wire is wound on the first wire in the second section, and
wherein the first wire is wound on the second wire in the third section.

6. A common mode filter comprising:
a core having first, second, and third sections, the second section being positioned between the first and third sections; and
first and second wires wound around the first, second, and third sections of the core,
wherein the first and second wires cross each other between the second and third sections,
wherein the first and second wires are wound in parallel with each other in the first section, and
wherein one of the first and second wires is wound on other of the first and second wires in the second and third sections.

7. The common mode filter as claimed in claim 6, wherein the first wire is wound on the second wire in each of the second and third sections.

8. The common mode filter as claimed in claim 6,
wherein the first wire is wound on the second wire in the second section, and
wherein the second wire is wound on the first wire in the third section.

9. The common mode filter as claimed in claim 6, wherein a number of turns of the first and second wires in the first section is smaller than that of the first and second wires in each of the second and third sections.

10. The common mode filter as claimed in claim 9, wherein a number of turns of the first and second wires in the second section is a same as that of the first and second wires in the third section.

\* \* \* \* \*